United States Patent [19]

Nichols

[11] Patent Number: 4,558,291
[45] Date of Patent: Dec. 10, 1985

[54] PHASE SHIFTER FOR BROADBAND RADIO SIGNAL

[75] Inventor: Richard A. Nichols, Richardson, Tex.
[73] Assignee: Rockwell International Corp., Dallas, Tex.
[21] Appl. No.: 454,137
[22] Filed: Dec. 28, 1982
[51] Int. Cl.[4] .......................... H03H 7/20; H03H 7/21
[52] U.S. Cl. ................................. 333/138; 333/81 R; 333/103; 333/139
[58] Field of Search ................... 333/138–140, 333/156–164, 1, 100, 101, 81 R, 103–108; 328/155; 307/317 R, 262

[56] References Cited

U.S. PATENT DOCUMENTS

| | | | |
|---|---|---|---|
| 3,323,080 | 5/1967 | Schwelb et al. | 333/157 |
| 3,739,103 | 6/1973 | Hess | 328/155 X |
| 4,056,792 | 11/1977 | Horwitz et al. | 333/156 |
| 4,224,583 | 9/1980 | Larkin | 333/103 |

Primary Examiner—Marvin L. Nussbaum

[57] ABSTRACT

A circuit capable of vector magnitude control and phase reversal for a radio signal such as an intermediate frequency signal. The circuit includes an inverting signal path and a noninverting signal path and means for selecting between the two. Further, a variable attenuation controllable from a function control input establishes the magnitude of the output signal vector. There is also disclosed a phase shifter employing two such circuits. In the phase shifter, a radio signal vector to be shifted is applied to the inputs of the two circuits, with a 90° shift between the two inputs. With proper vector magnitude and phase reversal control of the two circuits, there can be provided a preselected phase shift in any quadrant.

13 Claims, 3 Drawing Figures

PHASE SHIFTER FOR BROADBAND RADIO SIGNAL

BACKGROUND OF THE INVENTION

This invention relates to a phase shifter for a broadband radio signal, such as an IF signal, and to a circuit for controlling the vector magnitude and phase reversal of such a signal.

The present invention finds particular application in a high density space diversity radio system. Such a system is used to improve reliability in microwave radio, as a solution to the problem of frequency selective fading due to multipath propagation. Reliability is improved by combining signals received by separate antennas. Circuits according to the present invention can be used to control the phase of IF signals from two different receivers with respect to each other, so that the two signals can be combined in phase or in accordance with other combining strategies.

A prior art phase shifting technique used in this type of application employs a common local oscillator for two down-converters in space diversity receivers. The local oscillator output going to the receiver which is to be phase shifted is controlled by a narrow band phase shifter. This technique uses band-sensitive and expensive radio frequency components.

Another prior method of phase shifting employs sidestep conversion on an IF signal. This method is similar to the previously described one, except that it uses an up-converter and a down-converter. The local oscillator for the side-step conversion is split and, again, one side is narrow band phase shifted. This method can be used at a common IF frequency, regardless of the RF band of the receiver. Unfortunately, the method gives rise to high spurious products in the IF output and is extremely bad for high density FM receivers.

SUMMARY OF THE INVENTION

In accordance with one aspect of the invention, there is provided a circuit having a variable gain portion for controlling the vector magnitude of a broadband radio signal, such as an IF signal. The circuit further has a portion capable of selecting whether the magnitude controlled signal vector is to be inverted or not.

In another aspect of the invention, two of such magnitude and phase controlling circuits can be used in the implementation of a broadband phase shifter. The signal to be phase shifted is applied as an input to each of the circuits but with a 90° phase difference between the signal inputs. Magnitude and phase reversal selections are made by means of the circuits, and their outputs are combined, resulting in a signal vector with a phase shift selectable between 0° and 360°.

The invention provides phase shifting suitable for an IF combiner, which does not require RF components and which is free of spurious frequencies.

DESCRIPTION OF PREFERRED EMBODIMENTS

Figure 1:
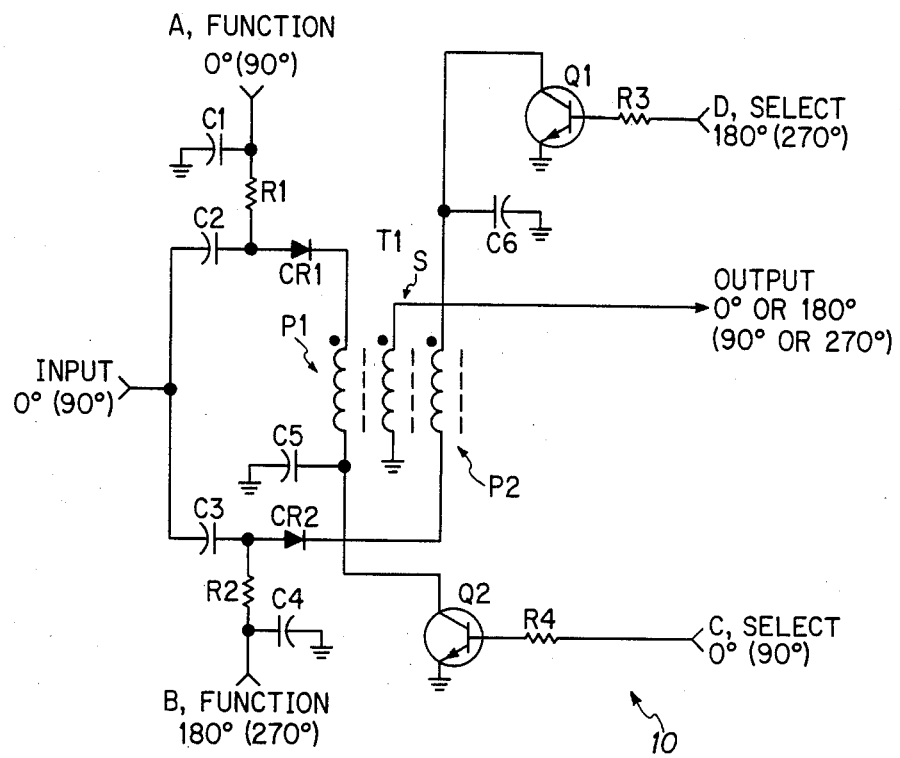
FIG. 1 is a schematic diagram of a vector magnitude control and phase reversal circuit in accordance with the invention.

FIG. 1 illustrates a circuit, indicated generally by the reference numeral 10, capable of vector magnitude control and phase reversal for a broadband radio signal. Two such circuits are employed in the phase shifter which is to be described in connection with FIG. 2. In the phase shifter, a radio signal, such as an IF signal, is split with one of the resulting signals being applied to a circuit like circuit 10, and the other of the resulting signals is applied, with a constant 90° phase shift, to another circuit like circuit 10. FIG. 1 is used to illustrate the operation of both circuits. Labels applicable to the circuit with the signal shifted 90° are shown in FIG. 1 in parenthesis. Thus, at the terminal marked INPUT, there is an indication of the input being at 0° phase shift angle; then, in parenthesis the indication is that the signal vector applied to the second circuit would be at 90°.

Circuit 10 has two main paths, one containing PIN diode CR1 and primary winding P1 of transformer T1. The other path contains PIN diode CR2 and primary P2 of transformer T1. The operations of the two paths are nearly identical, so most of the description will be directed at only one of them.

At the FUNCTION control input A, there is applied a bias level selected to control the magnitude of the signal vector output by circuit 10. When the SELECT input C is positive, switching on transistor Q2, bias current from the FUNCTION control input flows through a resistor R1, diode CR1, primary P1 and transistor Q2. The magnitude of the bias current through diode CR1 determines the resistance presented by the diode to the IF signal which is input to the circuit. It is by the control of the PIN diode resistance that circuit 10 exerts control over the magnitude of the radio signal.

Capacitor C1 connects the FUNCTION control input A to IF ground, isolating the FUNCTION control input source from the IF signal source. Capacitor C2 couples the IF signal to diode CR1 and resistance R1, but blocks the bias current of the FUNCTION control input from the IF signal source. Capacitor C5 places one terminal of primary P1 at IF ground.

Thus, when SELECT input C turns transistor Q2 on, the IF signal flows through capacitor C2, diode CR1, primary transformer P1 and capacitor C5. The signal level across primary P1 depends on the resistance of diode CR1 and therefore the bias generated at FUNCTION control input A. The signal across primary P1 is coupled, without inversion, to the secondary winding S of transformer T1 and thus to the OUTPUT terminal of circuit 10. Thus, when SELECT input C is activated, the output of circuit 10 is in phase with its input and scaled (in magnitude) in accordance with FUNCTION control input A.

If SELECT input C turns transistor T2 off, then diode CR1 operates in the zero bias condition, and presents a high resistance to the IF signal. Accordingly, in this mode, substantially no IF signal is coupled to the output of circuit 10.

The operation of the path including diode CR2 and transformer primary P2 is the same as the first path, except that the IF signal through diode CR2 is delivered inverted to the circuit output by means of transformer secondary S. Thus, if an inverted signal is desired from circuit 10, a positive input is applied to SELECT input D to switch on transistor Q1, while SE- LECT input C is not activated, leaving transistor Q2 off.

Figure 2:
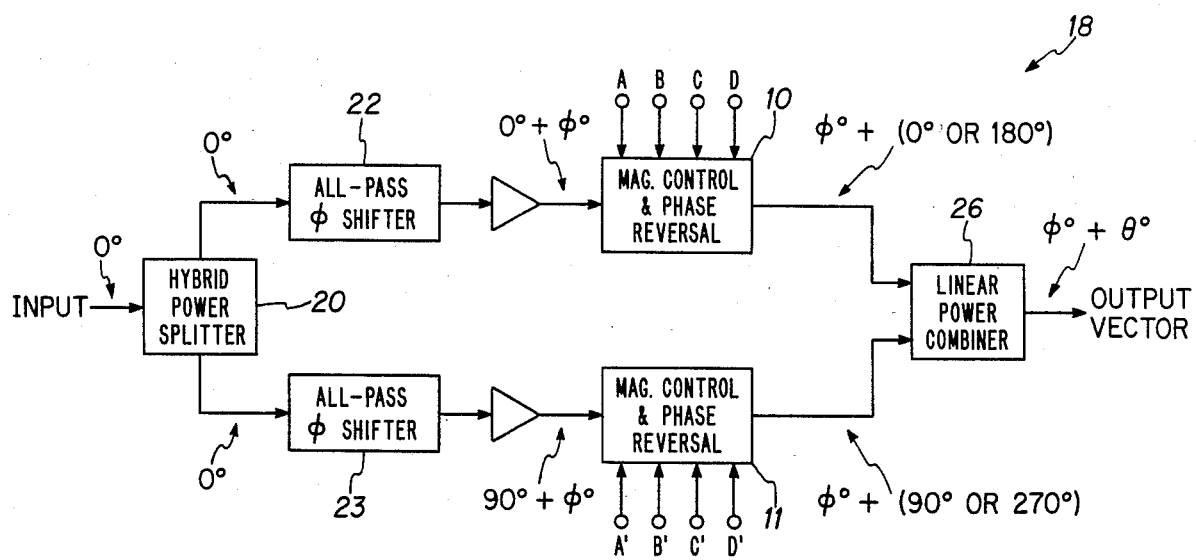
FIG. 2 is a block diagram of a phase shifter according to the invention.
Figure 3:
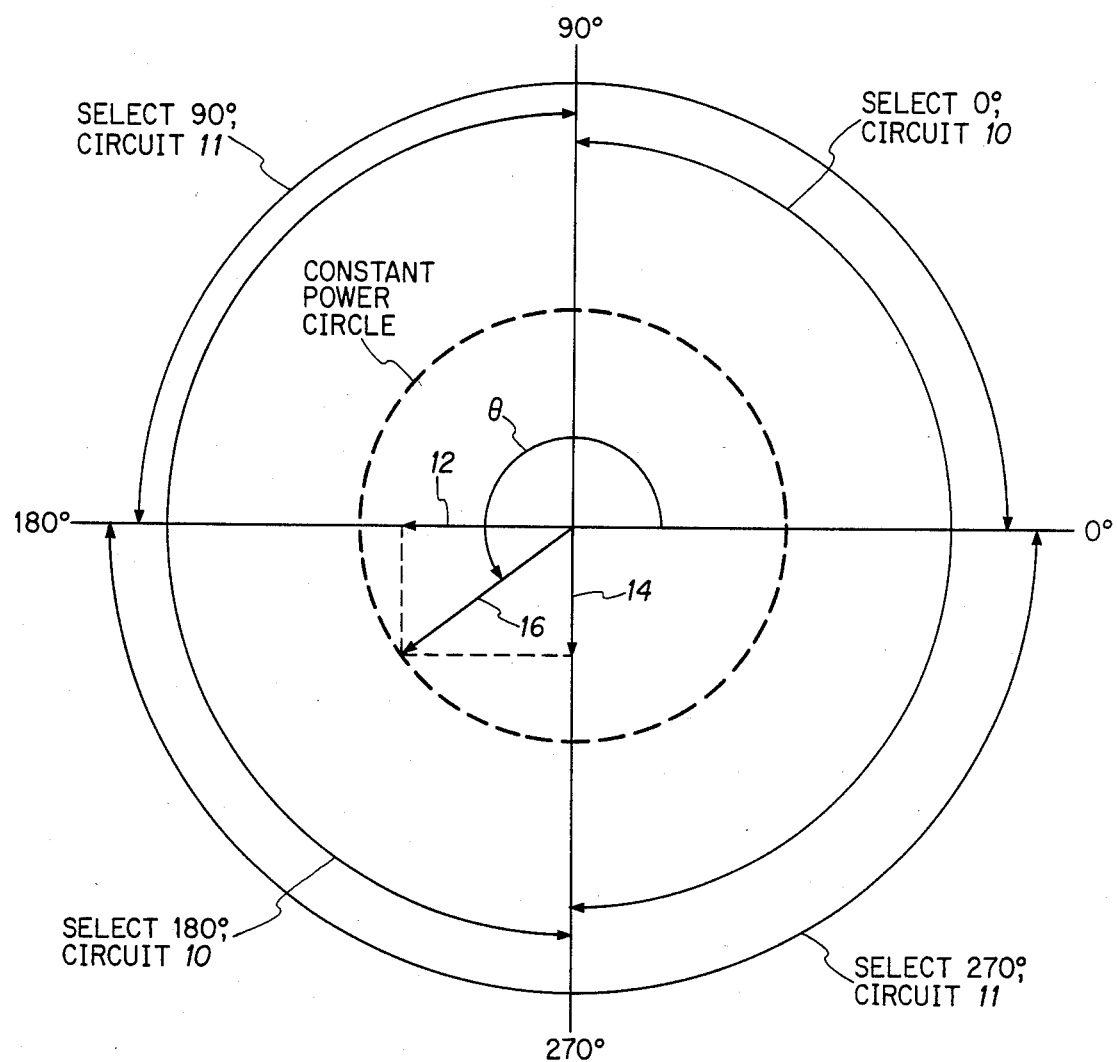
FIG. 3 is a vector and phase diagram illustrating the operation of the circuit of FIG. 1 and phase shifter of FIG. 2.

FIG. 3 is a vector and phase diagram illustrating the operation of the circuits of FIG. 1 and FIG. 2. If the SELECT 180° input D is activated, then the vector of the IF signal output of circuit 10 will be as vector 12 in FIG. 3. The magnitude of the vector 12 will, of course, be controlled by the bias level applied as FUNCTION 180° control input B. If the SELECT 0° input C and FUNCTION 0° control input A are employed, then the output signal vector will opposite in phase to vector 12 in FIG. 3. In FIG. 3, curved arrows labeled "SELECT 0°" and "SELECT 180°" indicate the respective sectors of the phase diagram controlled by these select inputs. Other curved arrows similarly labeled indicate sectors of the phase diagram controlled by the select 90° and select 270° inputs, as employed in circuit 11 of FIG. 2.

In the construction of the circuit of FIG. 1, there are certain practical considerations. The capacitors are selected to provide good bypass for the frequency band of interest, and lead lengths should be kept as short as possible. Resistors R1 and R2 will have a value high enough to not degrade input return loss with PIN diode bias current set for reference output level. The PIN diodes CR1 and CR2 should have very low junction capacitance in order to minimize positive frequency response slope at reduced output vector level, since this capacitance is in parallel with the resistance of the diode. The transformer T1 can be implemented using a trifilar winding on a high permeability toroid. The total wire length should not exceed 0.1 wavelength at the maximum frequency of operation.

The operation of a circuit actually constructed was such that the frequency response of a 60% bandwidth signal at 70 MHz was identical (within 0.02 dB peak-to-peak variation) for inverting and noninverting operation. The variation in phase for inverted versus noninverted operation was within 0.2° in the 60% bandwidth.

FIG. 2 illustrates how a phase shifter, generally referred to by the referenced numeral 18, can be embodied using circuit 10 and an identical circuit 11. In the phase shifter 18, an input IF signal vector is designated as having 0° phase shift. The input is to a hybrid power splitter 20, which introduces no phase shift. The outputs of splitter 20 are input to all pass phase shifters 22 and 23. Shifter 22 introduces a phase shift $\phi$ in the signal vector, and the signal thus shifted is input to circuit 10. Shifter 23 introduces a phase shift of $\phi \pm 90°$ into the IF signal vector, which is then input to circuit 11. Under control of inputs A-D, magnitude control and phase reversal circuit 10 can selectively introduce a phase shift of 0° or 180°. Circuit 11, under the control of comparable inputs A'-D' introduces a phase shift of 90° or 270°. The outputs of circuits 10 and 11 are taken to a linear power combiner 26 to sum them. The output of combiner 26, which is the output of the phase shifter, has introduced a shift of $\phi + \theta$, with $\theta$ being derived from the operations of circuits 10 and 11.

In FIG. 3, there is illustrated how the phase shift $\theta$ is produced. For example, if the SELECT 270° (D') input of circuit 11 is activated, then the phase shift introduced by circuit 11 is as indicated by vector 14 in FIG. 3. The magnitude of vector 14 is of course controlled by the FUNCTION 270° control input B'. Assuming by way of example that the output of circuit 10 is vector 12, then the action of combiner 26 is to produce the output vector 16, which has an associated phase angle $\theta$. It can be seen that the quadrant in which vector 16 lies is determined by the use of the four SELECT inputs C, D, C' and D', while the exact value of $\theta$ is obtained by controlling the magnitudes of vectors 12 and 14 through FUNCTION inputs A, B, A' and B'. Of course, if the overall phase shift $\phi + \theta$ to be introduced by circuit 18 is known, then $\theta$ is selected so that the sum $\phi + \theta$ equals the desired overall shift.

In FIG. 3, the tip of vector 16 lies on a circle labeled "CONSTANT POWER CIRCLE". This is to emphasize that it will generally be desirable, when generating various phase shifts $\theta$ to generate them in such a way that the resultant vector 16 has the same magnitude for each phase shift produced. In order to accomplish this the FUNCTION control inputs A, B, A' and B' are mutually controlled so that as the phase shift changes, the output power does not.

It will be apparent to those skilled in the art that phase shifter 18 can also be arranged so that the phase shift introduced by all-pass shifter 23 is $\phi - 90°$, rather than $\phi + 90°$. In the former case, vector 14 of FIG. 3 would be generated by the use of control inputs A' and C', no inversion being necessary in circuit 11.

Thus, in accordance with the invention, there is provided a circuit for producing magnitude and phase control for a radio signal such as an IF signal. In addition, two such circuits can be combined to provide a phase shifter which produces a preselected phase shift in any quadrant, without the use of expensive RF components or the introduction of high spurious frequencies.

I claim:

1. A circuit capable of vector magnitude control and phase reversal for an intermediate frequency radio signal, comprising:
   a first signal path leading from an input of said circuit and including a first transformer primary winding;
   a second signal path leading from said input and including a second transformer primary winding;
   a transformer secondary winding connected to deliver, to an output of said circuit, the signal from the first primary winding in a noninverted fashion and to deliver to said output in an inverted fashion the signal from the second primary winding;
   means, including a function control input, for interacting with said paths to provide at said output, the radio signal at said input scaled by a factor in accordance with the associated function control input; and
   means, including a select input, for selecting between said first and second paths.

2. A circuit capable of vector magnitude control and phase reversal for a broadband radio signal, comprising:
   first and second signal paths, each including variable means, receiving said radio signal and having a separate function control input, for providing said radio signal scaled by a factor in accordance with the associated function control input, said first path further including means for delivering the signal provided by the associated variable means to an output of said circuit, and said second path including means for delivering the signal provided by the associated variable means to the output of the circuit in inverted fashion; and
   means for selecting between said signal paths.

3. A circuit capable of vector magnitude control and phase reversal for a broadband radio signal, comprising:
   first and second variable means, each receiving said radio signal and each having a separate function control input, for providing said radio signal scaled by a factor in accordance with the associated function control input;

means, having a select input, for selecting said second variable means;

means, in response to the selection of said second variable means, for inverting the signal provided thereby and delivering the inverted signal as an output of said circuit;

means, having a select input, for selecting said first variable means, and noninverting means, in response to the selection of said first variable means, for delivering the signal provided by said first variable means as an output of said circuit.

4. The circuit of claim 3, wherein each of said variable means includes a PIN diode providing said radio signal as a current therethrough, and means for biasing said diode by establishing a bias current according to the magnitude of the associated function control input, whereby said current is dependent on said function control input magnitude.

5. The circuit of claim 4, wherein each of said means for selecting said variable means includes means connected to control whether said bias current flows in said diode for enabling said biasing of the PIN diode included in the selected variable means.

6. The circuit of claim 3, wherein said noninverting means includes a transformer having a primary winding connected to receive said radio signal from said first variable means, and a secondary winding connected to deliver said radio signal to said output in a noninverted condition.

7. The circuit of claim 3, wherein said means for inverting includes a transformer with a primary winding receiving said radio signal from said second variable means and a secondary winding connected to deliver said radio signal to said output in an inverted condition.

8. The circuit of claim 3, wherein said noninverting means includes a first transformer primary winding receiving said radio signal provided by said first variable means, said means for inverting includes a second transformer primary winding receiving said radio signal provided by said second variable means, and said means for inverting and said noninverting means include a transformer secondary winding connected to deliver to the circuit output the signal from the first primary winding in a noninverted fashion and to deliver in an inverted fashion the signal from the second primary winding.

9. The circuit of claim 8, wherein each of said variable means includes a PIN diode receiving said radio signal, and means for biasing said diode according to the function control input.

10. The circuit of claim 9, wherein each of said means for selecting said variable means includes means for enabling said biasing of said PIN diode included in the selected variable means.

11. A circuit capable of vector magnitude control and phase reversal for a broadband radio signal, comprising:

first and second paths, each including a PIN diode receiving said radio signal at a first terminal thereof, and a transformer primary winding connected by a first terminal thereof to the second terminal of the diode;

first and second means, each connected to respective ones of said diodes, each having a separate function control input and including a resistance connected between said function control input and the first terminal of the respective diode, for providing to the respective diode a bias according to the associated function control input and thereby providing said radio signal at the second terminal of the diode scaled by an attenuation factor in accordance with the associated function control input;

first and second means, connected to respective ones of said transformer primary windings and each including a transistor switch with a select input, for enabling said biasing of the associated PIN diode and thereby selecting one of said first and second paths; and a transformer secondary winding connected to couple from one of said first primary windings to an output of said circuit in a noninverted fashion and to couple from the other primary winding in an inverted fashion, whereby said radio signal can be coupled to said circuit output, with the magnitude controlled by said function control inputs and phase reversal controlled by said select inputs.

12. The circuit of claim 11, wherein each of said paths includes a capacitor coupling said radio signal to said diodes, said means for providing bias each including a capacitor providing coupling, at frequencies of the radio signal, to ground from the associated resistance at a terminal of the resistance not connected to the associated diode, and each of said transformer primary windings has a capacitor at a second terminal thereof providing coupling to ground at frequencies of the radio signal.

13. A phase shifter for a broadband radio signal vector, comprising:

two circuits, each capable of vector magnitude control and phase reversal for a signal input to the circuit and comprising:

first and second variable means, each receiving the input signal to the circuit and each having a separate function control input, for providing the circuit input signal scaled by a factor in accordance with the associated function control input, means, having a select input, for selecting said second variable means, means, in response to the selection of said second variable means, for inverting the signal provided thereby and delivering the inverted signal as an output of said circuit, means, having a select input, for selecting said first variable means, and noninverting means, in response to the selection of said first variable means, for delivering the signal provided by said first variable means as an output of said circuit;

means responsive to said broadband radio signal vector for providing said broadband radio signal vector as a first radio signal input to one of said vector magnitude and phase reversal control circuits;

means for providing said broadband radio signal vector shifted by ±90° compared to said first radio signal input as the radio signal input to the other of said vector magnitude control and phase reversal circuits; and means for providing as the output of said phase shifter, the summation of the outputs of said two vector magnitude control and phase reversal circuits.

* * * * *